United States Patent
Domanski et al.

(10) Patent No.: US 11,355,924 B2
(45) Date of Patent: Jun. 7, 2022

(54) CIRCUIT FOR ELECTROSTATIC DISCHARGE PROTECTION FOR WIDE FREQUENCY RANGE MULTI-BAND INTERFACES

(71) Applicant: Intel IP Corporation, Santa Clara, CA (US)

(72) Inventors: Krzysztof Domanski, Neubiberg (DE); David Johnsson, Neubiberg (DE); Harald Gossner, Riemerling (DE); Jenia Elkind, Kiryat Uno (IL)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/976,083

(22) PCT Filed: May 22, 2019

(86) PCT No.: PCT/US2019/033430
§ 371 (c)(1),
(2) Date: Aug. 27, 2020

(87) PCT Pub. No.: WO2020/005420
PCT Pub. Date: Jan. 2, 2020

(65) Prior Publication Data
US 2021/0044104 A1     Feb. 11, 2021

(30) Foreign Application Priority Data
Jun. 29, 2018 (EP) .................................... 18180978

(51) Int. Cl.
*H02H 9/02* (2006.01)
*H01L 27/02* (2006.01)
(Continued)

(52) U.S. Cl.
CPC ........... *H02H 9/02* (2013.01); *H01L 27/0251* (2013.01); *H01L 27/0288* (2013.01); *H02H 9/046* (2013.01); *H03H 11/04* (2013.01)

(58) Field of Classification Search
CPC ............ H02H 9/02; H02H 9/046; H02H 3/22; H02H 9/04; H01L 27/0288; H01L 27/0251; H03H 11/04; H03H 7/06; H03F 3/14
(Continued)

(56) References Cited

U.S. PATENT DOCUMENTS

| 2001/0015676 | A1* | 8/2001 | Takikawa | ............. H04B 1/0075 330/307 |
| 2011/0105055 | A1* | 5/2011 | Ilkov | ........................ H01P 1/15 455/93 |

(Continued)

FOREIGN PATENT DOCUMENTS

WO     2011026522 A1     3/2011

OTHER PUBLICATIONS

Wang Chenkun et al: "ESD and RF switch co-design in SOI CMOS for smartphones from 2G to 5G", 2018 Texas Symposium on Wireless and Microwave Circuits and Systems (WMCS), IEEE, Apr. 5, 2018, pp. 1-4, XP033368673.

*Primary Examiner* — Danny Nguyen
(74) *Attorney, Agent, or Firm* — 2SPL Patent Attorneys PartG mbB; Yong Beom Hwang

(57) ABSTRACT

A circuit for electrostatic discharge (ESD) protection for wide frequency range multi-band interfaces. The interface may be split into a plurality of signal paths. Each signal path may include an ESD protection circuit configured to shunt an ESD current on each signal path to either ground or supply voltage and a filter configured to block signals from other signal paths. The signal paths are connected to a common signal line such that the signals for the plurality of signal paths can be transported simultaneously. The plurality (Continued)

of signal paths may be a high frequency path and a low frequency path. The low frequency path may include an inductor connected in series and the high frequency path may include a capacitor or transformer connected in series. The ESD protection circuit on each signal path is placed behind the inductor, the capacitor or the transformer.

14 Claims, 10 Drawing Sheets

(51) Int. Cl.
  *H02H 9/04* (2006.01)
  *H03H 11/04* (2006.01)
(58) Field of Classification Search
  USPC .......................................................... 361/56
  See application file for complete search history.

(56) References Cited

U.S. PATENT DOCUMENTS

| | | | |
|---|---|---|---|
| 2011/0187449 A1* | 8/2011 | Koechlin | H01P 1/20381 |
| | | | 327/553 |
| 2011/0267119 A1* | 11/2011 | Koechlin | H03H 7/19 |
| | | | 327/158 |
| 2012/0094623 A1 | 4/2012 | Khlat et al. | |
| 2012/0122522 A1 | 5/2012 | Jang et al. | |
| 2013/0154761 A1* | 6/2013 | Ilkov | H04B 1/0057 |
| | | | 333/101 |
| 2014/0334048 A1 | 11/2014 | Muhonen | |
| 2015/0091775 A1 | 4/2015 | Jang et al. | |
| 2016/0013638 A1 | 1/2016 | Glas et al. | |
| 2017/0373493 A1 | 12/2017 | Morf et al. | |
| 2018/0083609 A1 | 3/2018 | Kunishi et al. | |
| 2018/0131176 A1 | 5/2018 | Fast, Jr. | |

\* cited by examiner

CIRCUIT FOR ELECTROSTATIC DISCHARGE PROTECTION FOR WIDE FREQUENCY RANGE MULTI-BAND INTERFACES

FIELD

Examples relate to electrostatic discharge protection for electrostatic sensitive devices, more particularly, to a circuit for electrostatic discharge protection for wide frequency range multi-band interfaces.

BACKGROUND

Electrostatic sensitive devices can be damaged by static charges built up on people, tools, other non-conductors or semiconductors, etc. Electrostatic discharge (ESD) protection schemes have been implemented for protecting electrostatic sensitive devices from the ESD.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
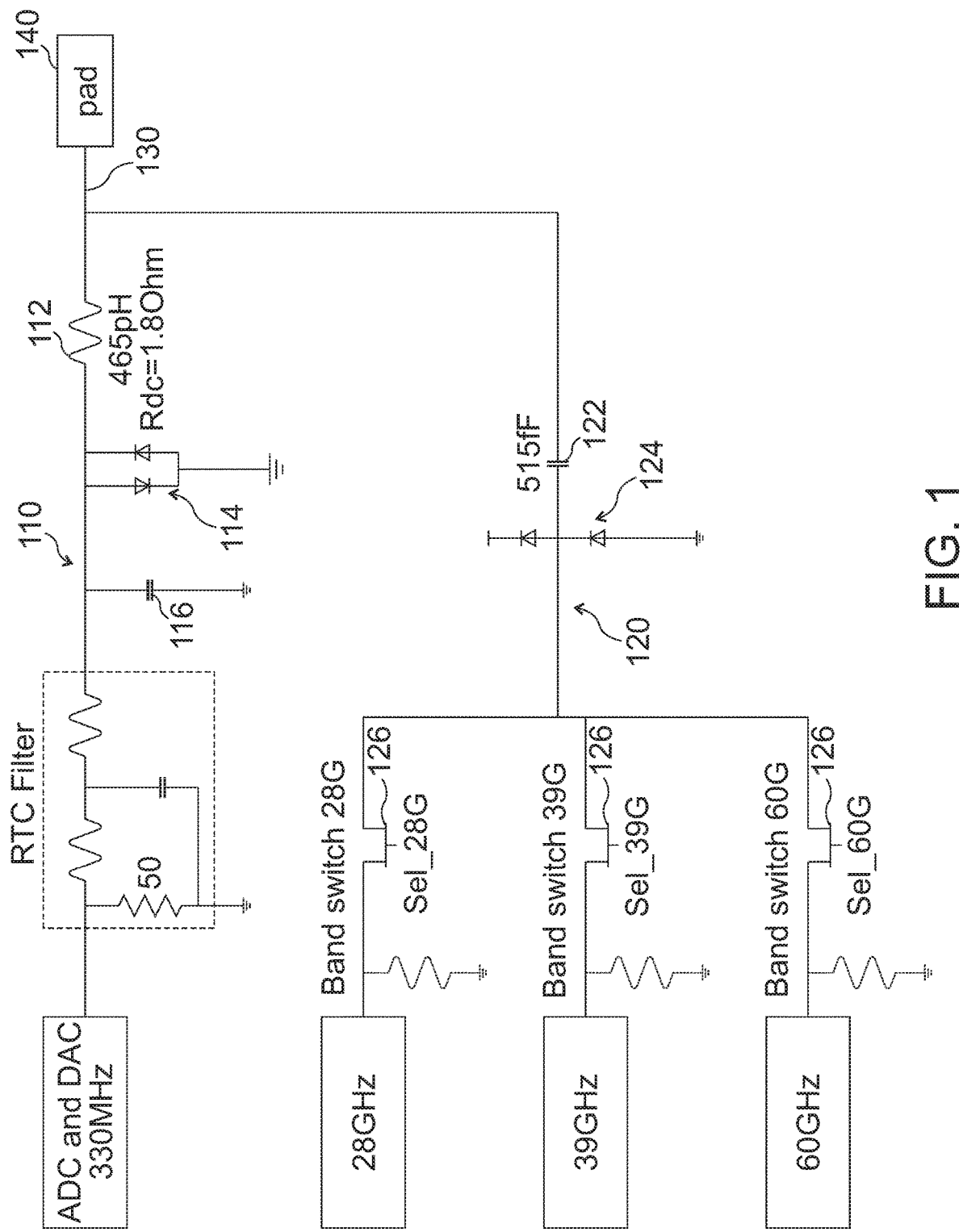
FIG. 1 shows an example circuit for mm-wave Fifth Generation (5G) interfaces using ESD protection in accordance with one example.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

The Third Generation Partnership Project (3GPP) 5G wireless communication systems are being developed. The 5G system will support wide range multi-band interfaces. The 5G interfaces work at multi-band frequencies of 100 MHz-60 GHz. For such interfaces the budget for capacitive load of electrostatic sensitive devices at a pad should be kept below 15 fF and the series resistance with the pad should be smaller than 1 Ohm.

The conventional ESD protection schemes have multi-stage ESD protection with series resistances greater than 50 Ohm. The application of a traditional two-stage ESD protection (large primary diodes, ESD resistor, and small second stage diodes) with a series resistor of, for example, 50 Ohm would not be possible in the 5G interfaces. To drive the high frequency signals, the resistance of less than 1 Ohm is required in series with a pad.

Moreover, since the 5G interfaces work with frequencies up to 60 GHz, they need to be realized with core devices at the pad due to circuit performance. In modern low-power complementary metal oxide semi-silicon (CMOS) technologies these devices are very sensitive to overvoltage under an ESD event at input/output (I/O). Usually the electrostatic sensitive devices can be damaged at 3-4 V of overvoltage. Thus, the ESD path to the supply voltage ($V_{SS}$) or ground ($V_{DD}$) should be extremely low-ohmic (e.g. smaller than 1 Ohm) to shunt the stress of 1 Amp/100 ns of ESD currents under the human body model (HBM) or 3 Amp/1 ns of ESD currents under the charge device model (CDM) stress. The ESD diodes with 1 Ohm of resistance usually have a junction capacitance in the range of 300 to 500 fF. That large capacitive load cannot be tolerated on the 5G interface, which has a budget for ESD capacitance of about 10 fF.

The 5G mm-wave radio frequency (RF) front-end interface is a multi-band interface which works at several frequency bands, such as 100 MHz, 28 GHz, 39 GHz, and 60 GHz. The 100 MHz band is used for control signals and the higher frequency bands are used for data transfer in 5G. In some applications, a direct current (DC) supply voltage might be delivered by that interface. Therefore, the conventional low-cap schemes for ESD protection for narrow-band RF interfaces cannot be applied to the 5G RF front-end interface. The conventional low-cap ESD schemes are based on e.g. inductors shunting ESD current to $V_{DD}$ or $V_{SS}$. These inductors have a high impedance in the narrow-band RF frequency spectrum of the RF signal (e.g. above 28 GHz) and are low-ohmic in the frequency spectrum of ESD stress (~1 GHz). For the 5G interface between the RF front-end and a transceiver the ESD protection should stay high-ohmic during normal operation in the entire frequency spectrum of the RF signal, for example, from 100 MHz to 60 GHz.

Examples are disclosed for an innovative scheme for the ESD protection for a wide frequency range such as multi-band 5G interfaces. Examples are disclosed for a completely new architecture of ESD protection in order to comply with the tight ESD specifications for the mm-wave interface in 5G, or the like. Hereafter, the examples will be explained with reference to the 3GPP 5G. However, it should be noted that the examples are not limited to 5G but may be applicable to any wireless communication standards, for example, any mm-wave applications such as WiGig, etc. In general, the examples can also be applied to serdes or any broadband high-speed interfaces, if the signal can be reconstructed from low and high frequency band receive branches. The ESD protection scheme in accordance with the examples disclosed herein can be individually optimized for high and low frequencies while maintaining high frequency performance. It should be noted that the numerical description such as the resistance, inductance and capacitance values provided in the drawings and description are merely example values and different values be may be selected depending on the performance requirements.

FIG. 1 shows an example circuit for mm-wave 5G interfaces using ESD protection in accordance with one example. The example circuit allows an ESD protection for the mm-wave 5G interfaces that are exposed to the external world. The 5G mm-wave radio frequency (RF) front-end interface may include a multi-band interface that operates at several frequency bands, in this example, 330 MHz, 28 GHz, 39 GHz, and 60 GHz. The 330 MHz band may be used for control signals and the 28 GHz, 39 GHz, and 60 GHz frequency bands may be used for data transfer in the 5G.

In examples, the mm-wave 5G interfaces may be split into a plurality of (e.g. two or more) signal paths (e.g. the signal paths 110, 120). The plurality of signal paths are connected to a common signal line (e.g. the signal line 130) that is connected to an input/output (I/O) pad such that signals for the plurality of signal paths may be transported simultaneously or subsequently through the common signal line (e.g. high frequency signals (GHz) and low frequency signals (MHz) can be transported simultaneously or subsequently on the common signal line). Each signal path may include an ESD protection circuit (e.g. ESD diodes 114, 124) configured to shunt an ESD current on each signal path to either ground or supply voltage and a filter (such as an inductor 112, a capacitor 122, or a transformer 522) configured to block signals from other signal paths. The filter configured to block signals from other signal paths 110, 120 is placed between the common signal line 130 and the ESD protection circuit 114, 124. FIGS. 1-5 show ESD diodes 114, 124 as an example of the ESD protection circuit, and a set of ESD silicon-controlled rectifiers (SCRs), gate-grounded n-channel/p-channel metal oxide semi-silicon (ggN/PMOS), or any ESD breakdown devices may be used.

For example, referring to FIG. 1, the mm-wave 5G interfaces may be split into two branches: a low frequency (LF) path 110 (e.g. the 330 MHz path) and a high frequency (HF) path 120 (e.g. the 28 GHz, 39 GHz, and 60 GHz paths). The 28 GHz, 39 GHz, and 60 GHz band components may be connected to the high frequency path 120 via band switches 126, respectively. The low frequency path 110 is connected to a pad 140 via an inductor 112 (e.g. inductance of 465 pH with a real part of 1.6 Ohm) and an ESD protection circuit such as ESD diodes 114 (e.g. diodes capacitance C=60 fF) are placed behind the inductor 112. The low frequency path 110 may be referred to as a primary ESD path and the high frequency path 120 may be referred to as a secondary ESD path since the major portion of the ESD current would flow in the low frequency path 110. The ESD protection circuit 114 attached to low-frequency path 110 is dimensioned to clamp the major part of the ESD current. Therefore, the size of the ESD protection circuit 114 on the low-frequency path 110 should be greater than the ESD protection circuit 124 on the high-frequency path 120.

The ESD protection circuit may be a set of clamping diodes (or transistors) connected to either ground or power supply such that for normal range of input voltages the diodes are in an off state, but if the input voltage builds up above or below a certain level, one of the diodes starts to conduct clamping the input voltage at a safe level. The inductor 112 may provide high impedance at high frequencies (e.g. above 10 GHz). The inductor 112 isolates high frequency signals (e.g. mm-wave signals) from the ESD diodes 114. Therefore, the capacitive load of the ESD diodes 114 may not harm the 5G data signal on the high frequency path 120. A capacitor 116 (e.g. 1 pF) may be connected in parallel in the low frequency path 110 for mm-wave filtering.

In the low frequency path 110, the ESD current is shunted to ground or supply voltage via the ESD diodes 114 connected via the inductor 112. The CDM current discharge can have a rise time in the range of 20 ps. Such a fast current pulse can cause a significant overvoltage at the inductor 112 placed in series with the ESD diodes 114. Such overvoltage could damage the sensitive core devices connected to the pad 140.

In order to decouple the sensitive devices connected in the high frequency path 120 (such as band switches 126, etc.) from the pad 140, a capacitor 122 (e.g. a 515 fF capacitor) may be inserted in series in the high frequency path 120. Alternatively, a transformer (e.g. a balun transformer) may be used instead of a capacitor 122. The capacitor 122 provides an impedance to the overvoltage present at the pad 140 under fast slopes of the ESD pulse. Behind the capacitor 122 an ESD protection circuit (e.g. ESD diodes 124) is connected to shunt an ESD current to $V_{DD}$ and $V_{SS}$. The ESD diodes 124 add a capacitive load of, e.g., 15 fF to the pad 140, which is visible to the 5G signal. The ESD diodes 124 shunt the very fast transients of ESD current passing through the capacitor 122 to the power supply or to the ground, thus, protecting the sensitive devices (e.g. band switches 126, etc.) from overvoltage. In this way, the voltage at the ESD sensitive devices in the high frequency path 120 may be kept below the limit for permanent damage (e.g. at 3-4 V). The high voltage appearing during the initial phase of the ESD pulse at the inductor 112 in the low frequency path 110 is largely reduced across the capacitor 122 without degrading the performance of the high frequency interface at several tens of GHz.

In cases where the AC capacitance of the capacitor 122 needs to be increased due to high frequency performance reasons, a varactor may be used as the capacitor 122. The varactor may be controlled by an ESD detection circuit tuning the capacitance to a lower value in case of ESD events and to a higher value during normal operations.

Figure 2A:
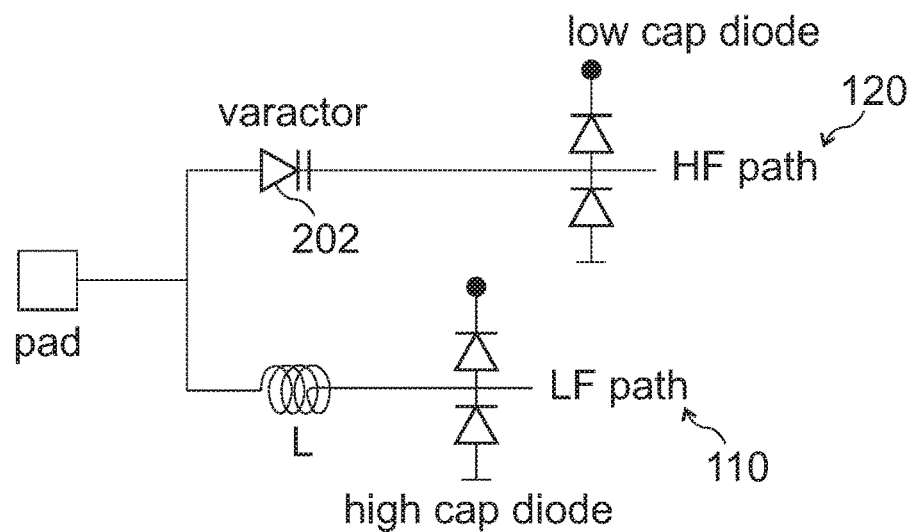
FIGS. 2A-2C show several examples of using a varactor in the high frequency path instead of an alternating current (AC) capacitor in FIG. 1.
Figure 2B:
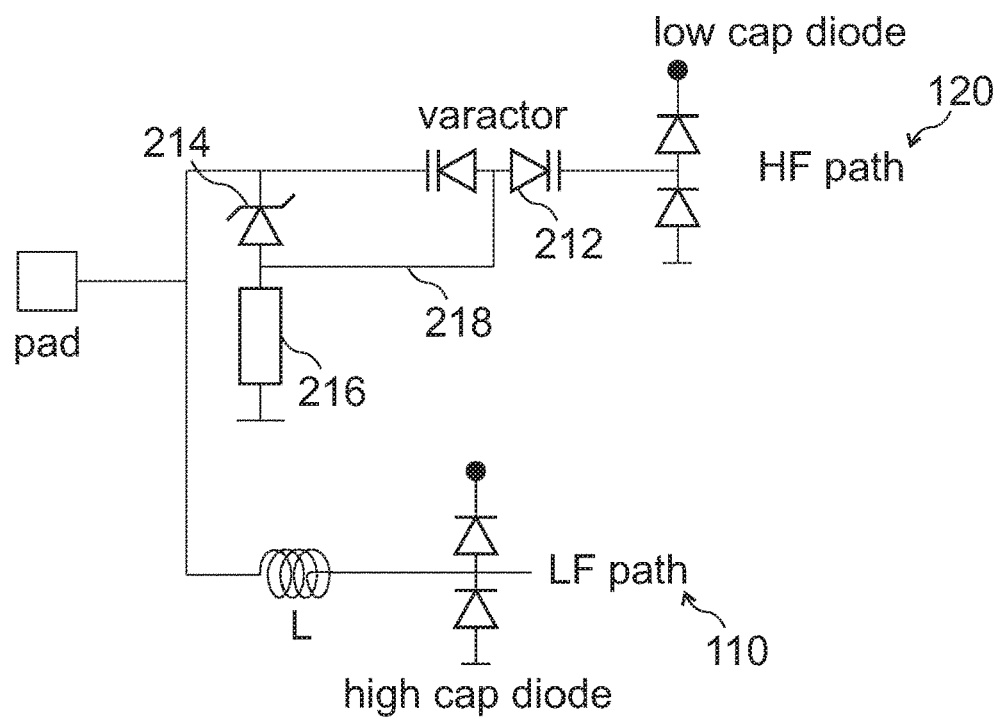
Figure 2C:
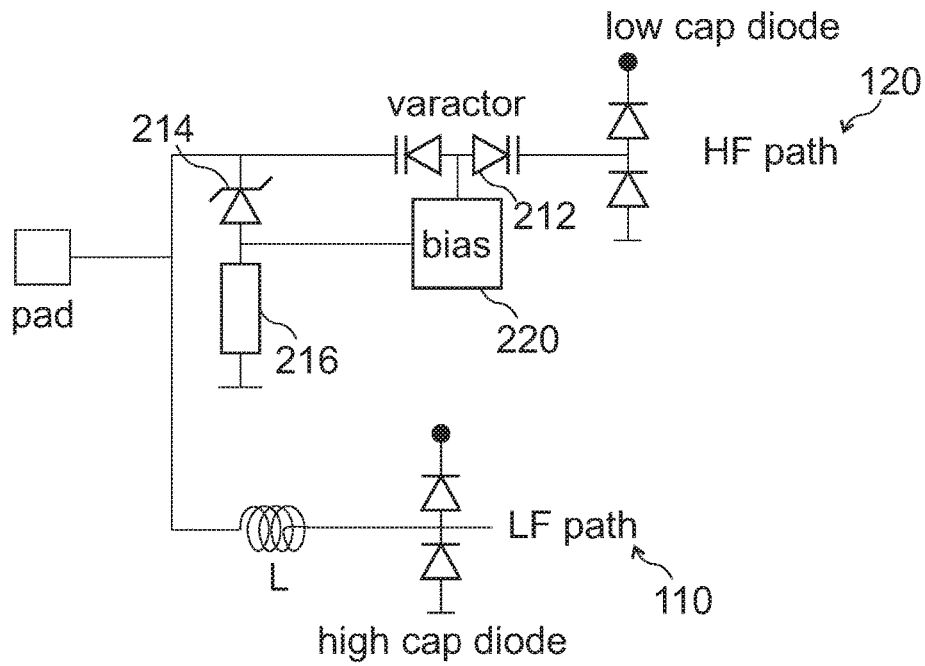

FIGS. 2A-2C show several examples of using a varactor in the high frequency path 120 instead of an AC capacitor 122 in FIG. 1. FIG. 2A shows an example that a varactor 202 is used in place of the AC capacitor 122 in FIG. 1 in the high frequency path 120. A varactor 202 is a type of diode designed to exploit the voltage-dependent capacitance of a reversed-biased p-n junction. The varactor 202 is used as a voltage-controlled capacitor such that the capacitance is controlled to a lower value in case of ESD events and to a higher value during normal operations.

FIGS. 2B and 2C show an example of using a varactor with an example ESD detection circuit (Zener diode circuit in this example). In FIG. 2B, two back-to-back (anode-to-anode), series-connected varactors 212 are used with a parallel-connected Zener diode 214 with a series-connected resistor 216. The anodes of the varactor and the Zener diode are connected (a line 218) such that during a normal operation, the Zener diode 214 will not conduct, and the capacitance of the varactor 212 will remain high. In case of ESD event, the Zener diode 214 will conduct and the bias voltage across the varactor 212 will be reduced and the capacitance of the varactor 212 will be lowered. FIG. 2C shows another example of using a varactor in similar structure as in FIG. 2B but having an additional bias 220 connecting between the anodes of the varactor 212 and the Zener diode 214.

As shown in FIG. 1, the ESD diodes 114 in the low frequency path 110 are connected via the inductor 112 (e.g. L=456 pH). The inductor 112 can cause significant over-voltage at the pad 140 during the fast rising edge or falling edge of the CDM current pulse. The increase of voltage at the pad 140 also causes an increase of the voltage in the high frequency path 120, coupled via the capacitor 122, and stress of the ESD sensitive devices on the high frequency path 120. The current in the high frequency path 120 is shunted to ground via small low-cap ESD diodes 124. However, if the over-voltage pulse is high, the clamping voltage may become too high for sensitive thin-gate oxide (GOX) high frequency devices.

In some examples, in order to protect the ESD sensitive devices in the high frequency path 120 one or more metal-oxide-semiconductor (MOS) switches 302 (e.g. transfer gates N1 . . . Nn) may be used in series as shown in FIG. 3, if compatible to high frequency requirements.

Figure 3:
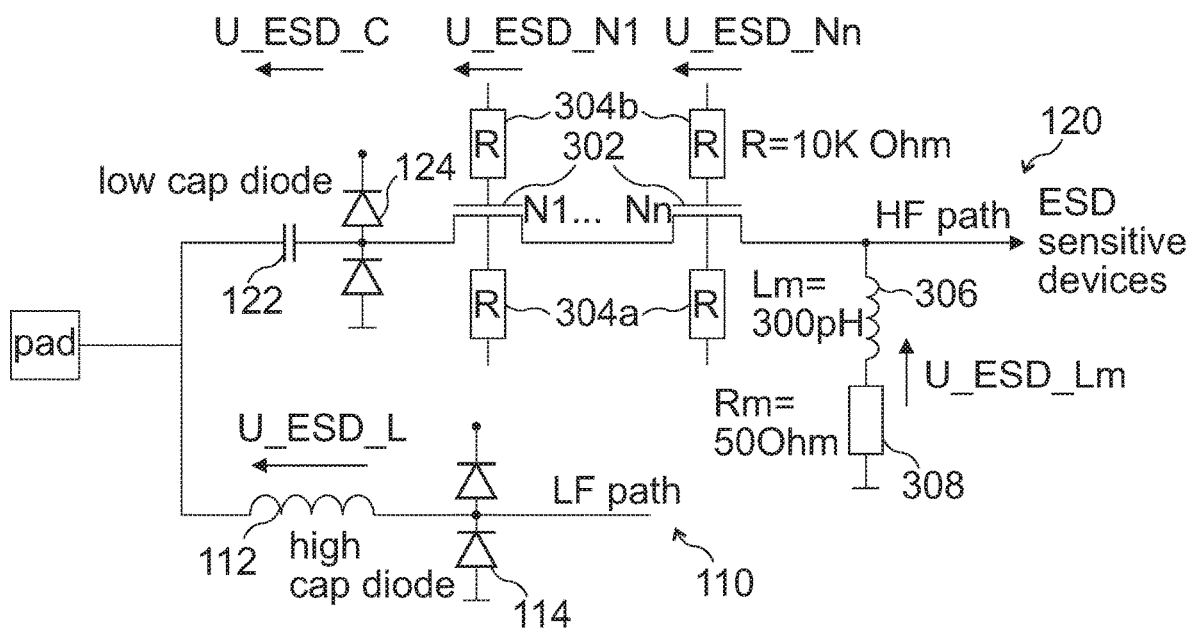
FIG. 3 shows an example for mitigating a voltage peak over the inductor in the low frequency path under a charge device model (CDM) current.

FIG. 3 shows an example for mitigating a voltage peak (U_ESD_L) over the inductor 112 in the low frequency path 110 under a CDM current. One or more MOS switches 302 may be inserted in series in the high frequency path 120 between the ESD diodes 124 and the electrostatic sensitive devices on the high frequency path 120. The MOS switches 302 in the high frequency path 120 may be made of thin-GOX devices which are sensitive to ESD. To sustain the over-voltage under the CDM current, the MOS switches 302 may be equipped with resistors 304a/304b at the bulk and/or gate of the MOS switches 302. For example, each resistor 304a/304b may be of 10K Ohm.

In case of an over-voltage event due to CDM the resistor 304a in the bulk assists the current conduction by biasing the base of a parasitic NPN transistor inherent to the MOS switch 302. Once turned on, the parasitic NPN transistor of the MOS switch 302 may drive an ESD current without damage to the devices.

A resistor 304b (e.g. 10K Ohm) connected to the gate of the MOS switch 302 may prevent the over-voltage between the drain and the gate of the MOS switches 302. The resistor 304b forms an RC bridge together with the Miller capacitor of the sensitive gate of the MOS switch 302. That RC bridge may protect the gate from over-voltage for at least the time equivalent to the duration of the CDM pulse.

The termination (a matching network) that may include a resistor 308 (e.g. Rm=50 Ohm) and/or an inductor 306 (e.g. Lm=300 pH) that are connected in series or parallel may shunt the current induced in the high frequency path 120 to ground. The resistor 308 and/or the inductor 306 may also provide a voltage drop in the current path to ground. The voltage at sensitive high frequency devices may be clamped below the breakdown value by adjusting the number of MOS switches 302 N1 . . . Nn and the resistance and/or the inductance values of the resistor 308 and the inductor 306. Correspondingly, the large voltage U_ESD_L may drop over several devices (C, N1 . . . Nn, Lm, Rm, etc.) connected in series in the high frequency path 120. The voltage U_ESD_C, U_ESD_N1 . . . Nn, U_ESD_Lm is smaller than the damage voltage of those devices.

Figure 4:
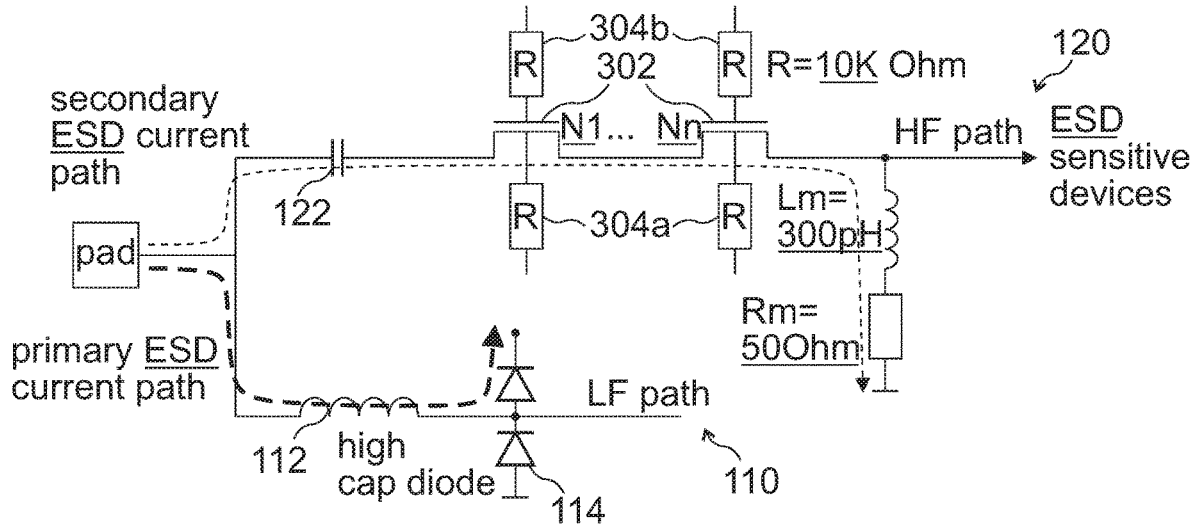
FIGS. 4 and 5 show another example circuit for ESD protection.

FIG. 4 shows another example circuit for ESD protection. As in other examples, the interface circuit is split into multiple signal paths, e.g. a low frequency path 110 and a high frequency path 120. In the low frequency path 110, the high-cap diode 114 may be placed behind the inductor 112 for protection from the major ESD currents. In the high frequency path 120, one or more MOS switches 302 may be inserted in series behind the capacitor 122. In this example, the low-cap diodes (124 in FIG. 3) may not be inserted in the high frequency path 120 and the ESD currents may flow through the switching devices (i.e. the MOS switches 302).

Figure 5:
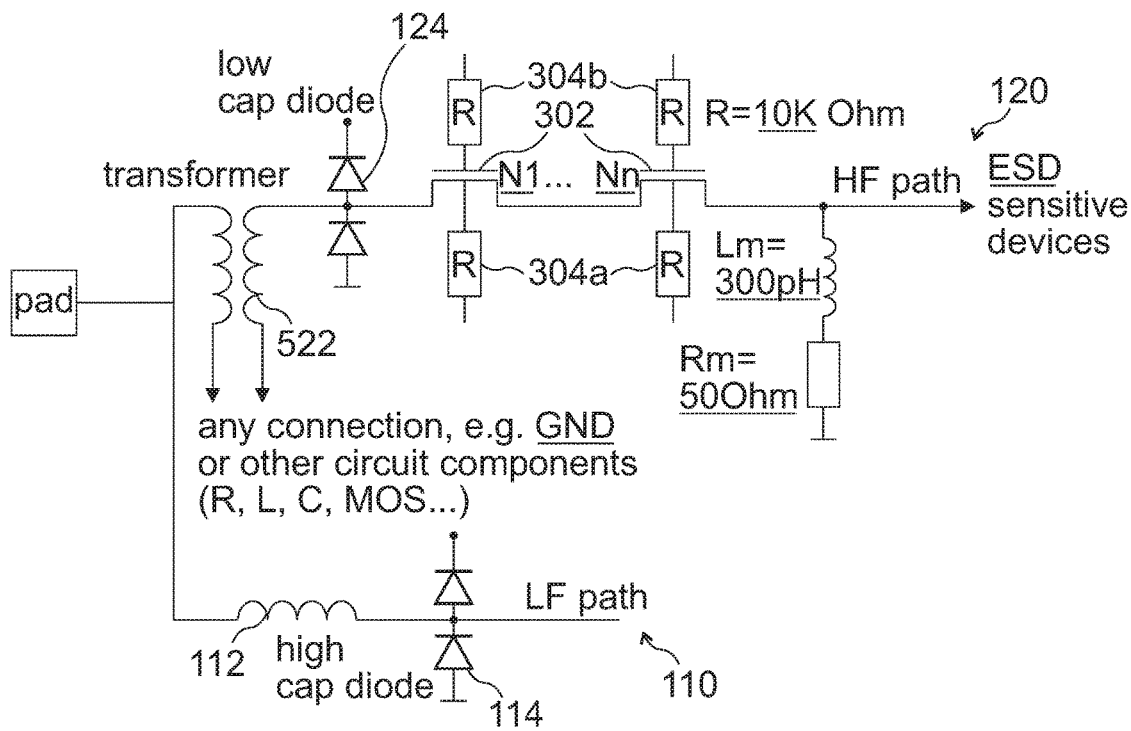

FIG. 5 shows another example circuit for ESD protection. The interface circuit is split into multiple signal paths, e.g. a low frequency path 110 and a high frequency path 120. In the low frequency path 110, the high-cap diode 114 may be placed behind the inductor 112 for protection from the major ESD currents. In the high frequency path 120, instead of a capacitor, a transformer 522 may be used as a decoupling element. The primary winding of the transformer 522 is connected to the pad and the ground, and the secondary winding of the transformer 522 may be connected to the ground or one or more high frequency nodes.

The features in the examples shown in FIGS. 1-5 may be used in any combination.

Figure 6:
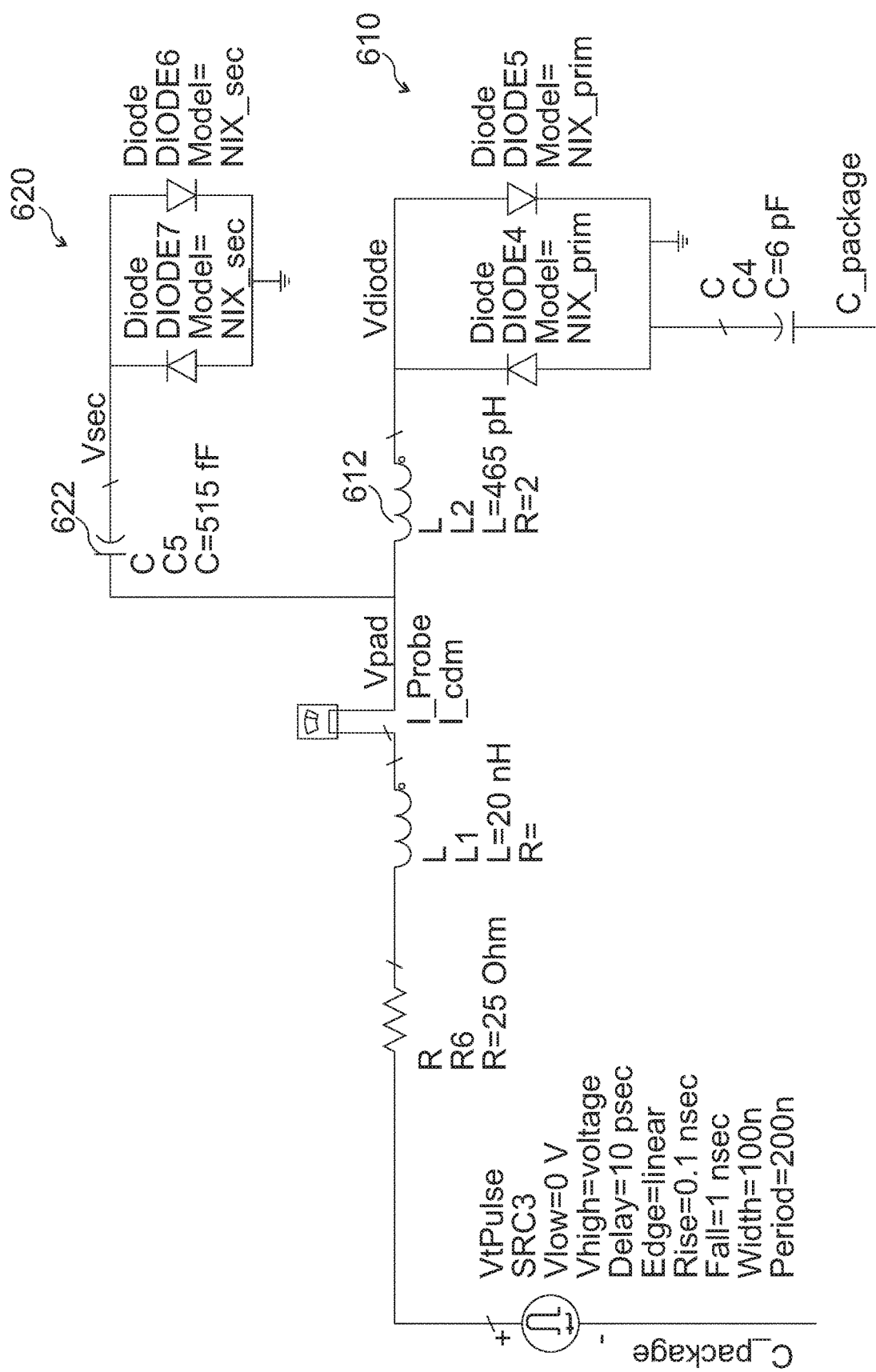
FIG. 6 is a circuit used for SPICE simulation of the ESD CDM event.
Figure 7:
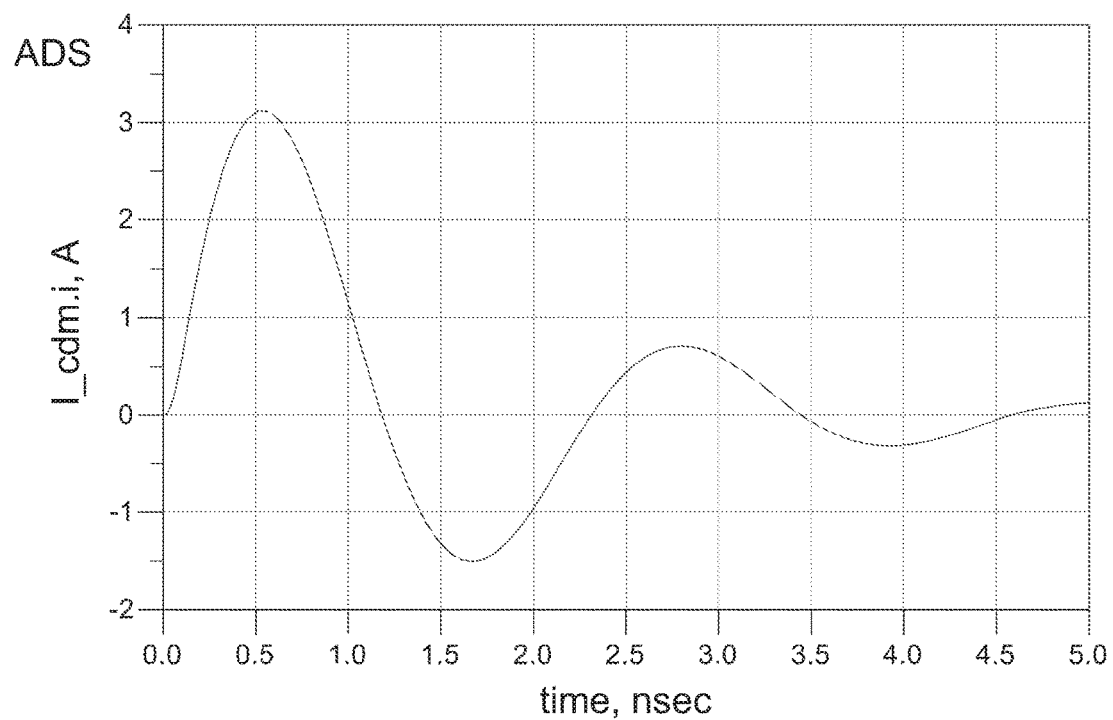
FIG. 7 shows a simulated CDM current waveform applied at a pad.
Figure 8:
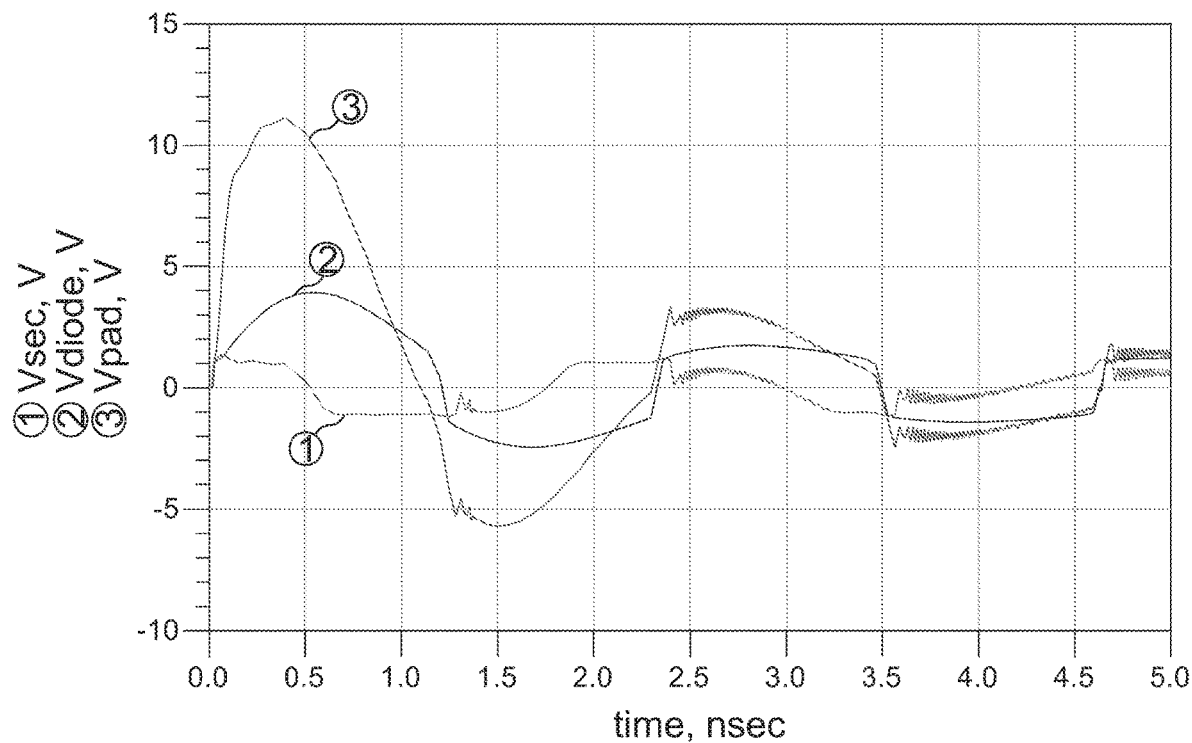
FIG. 8 shows simulated voltage at the sensitive core devices in circuit under the ESD CDM stress.

FIG. 6 is a circuit used for SPICE simulation of the ESD CDM event. In FIG. 6, the circuit is split into a high frequency branch 620 and the low frequency branch 610 that are separated with a capacitor 622 and an inductor 612, respectively. FIG. 7 shows a simulated CDM current waveform applied at a pad. FIG. 8 shows simulated voltage at the sensitive core devices in circuit under the ESD CDM stress.

As shown in the simulation results in FIG. 8, the voltage (Vsec in FIG. 8) at the high frequency receive node can be limited to less than 1.5 V while at the pad (Vpad in FIG. 8) more than 10 V appear during the CDM stress. The circuit may be dimensioned in a way to work effectively over a wide range of pulse and load conditions.

Figure 9:
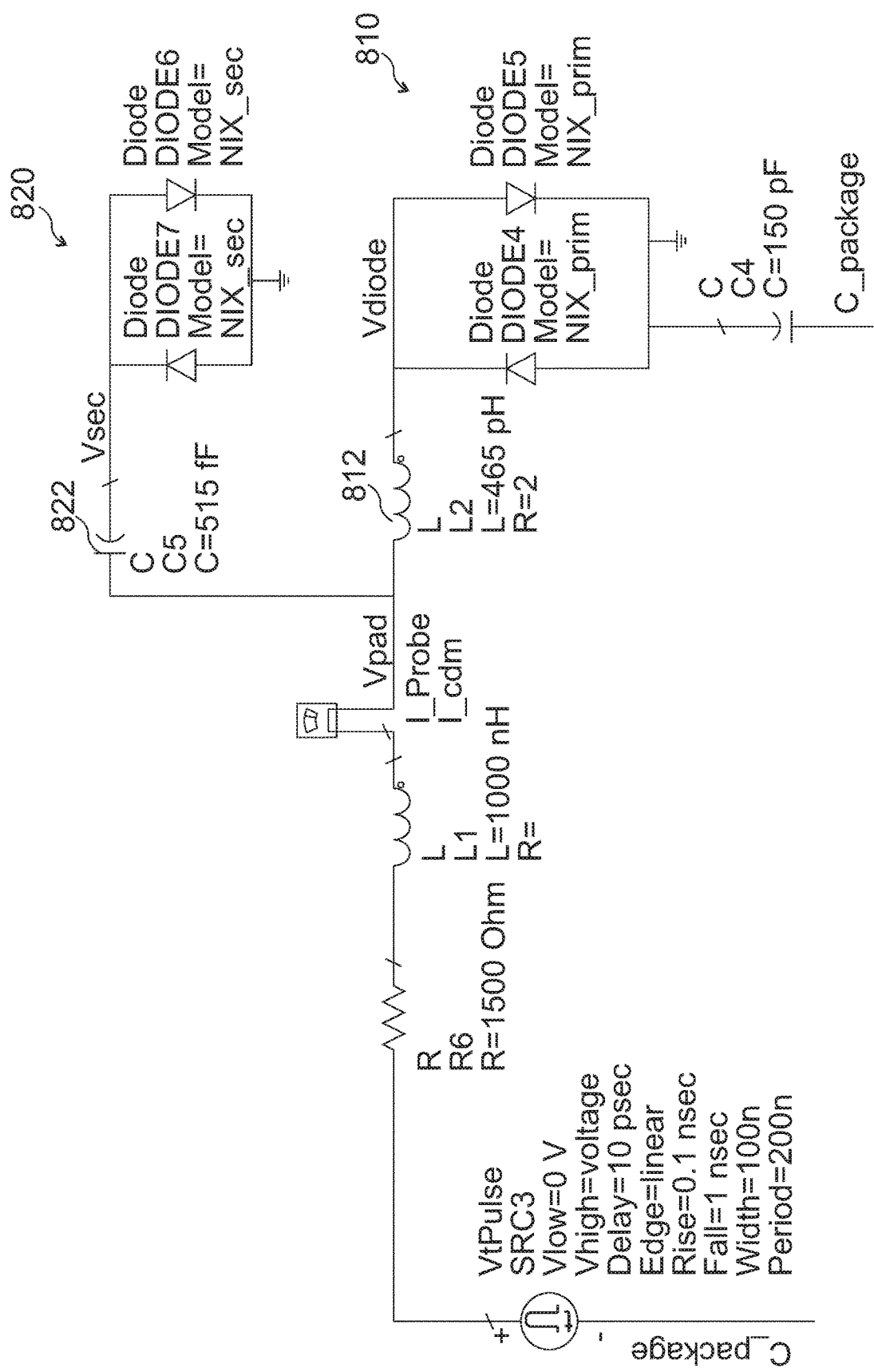
FIG. 9 is a circuit used for SPICE simulation of the ESD human body model (HBM) event.
Figure 10:
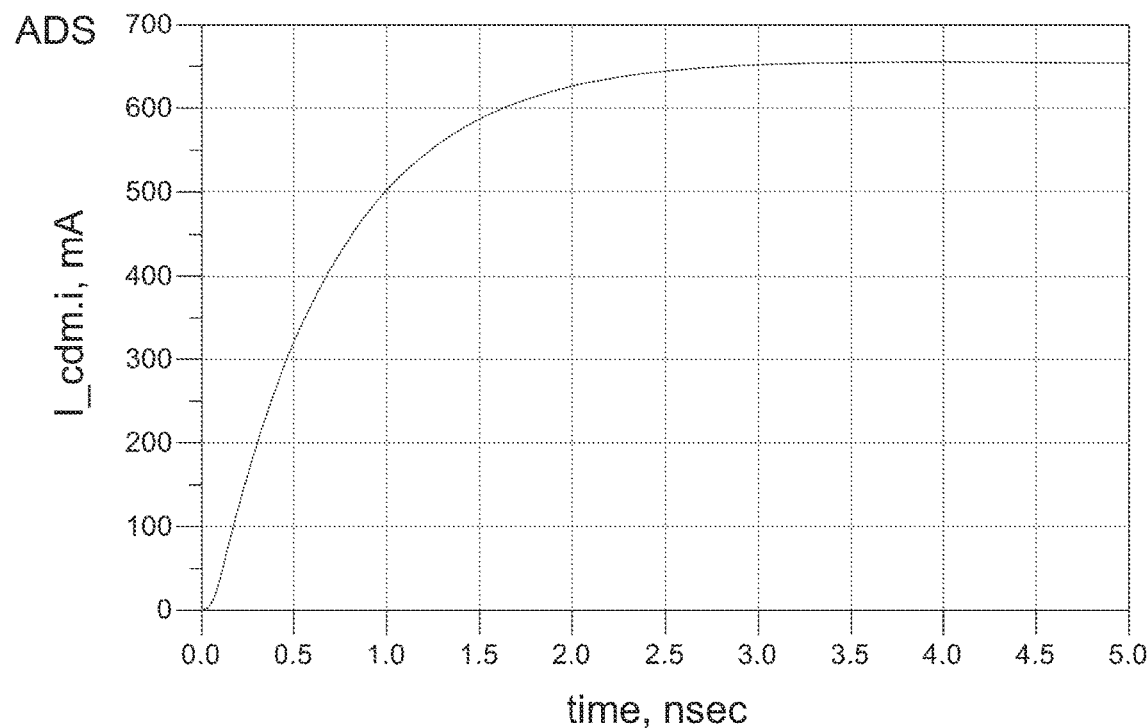
FIG. 10 is a simulated HBM current waveform applied at a pad.
Figure 11:
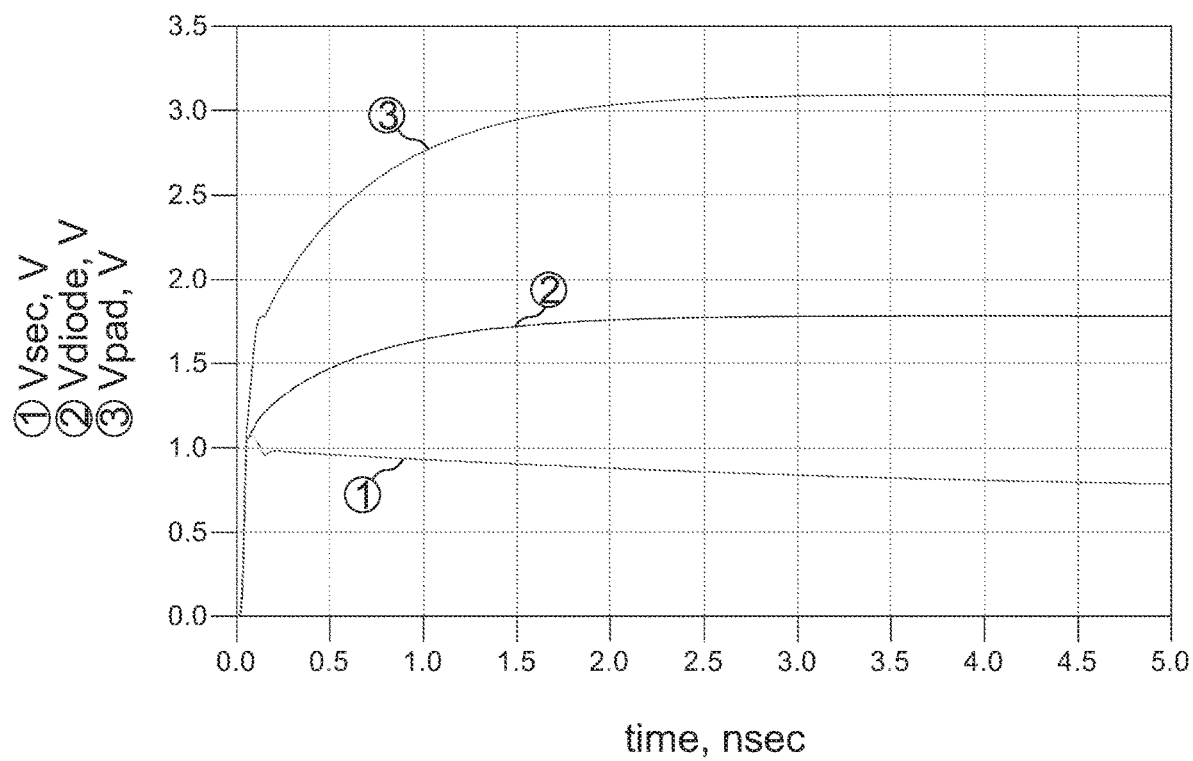
FIG. 11 is the simulated voltage at the sensitive core devices in circuit under ESD HBM stress.

FIG. 9 is a circuit used for SPICE simulation of the ESD HBM event. In FIG. 9, the circuit is split into a high frequency branch 920 and the low frequency branch 910 that are separated with a capacitor 922 and an inductor 912, respectively. FIG. 10 is a simulated HBM current waveform applied at a pad. FIG. 11 is the simulated voltage at the sensitive core devices in circuit under ESD HBM stress. As shown in the simulation results in FIG. 11, under the HBM conditions the voltage (Vsec in FIG. 11) at the receive node in the high frequency branch is clamped to lower than 1.2 V.

The simulation results show the effectiveness of the ESD protection in accordance with the examples disclosed herein for both CDM and HBM conditions.

Figure 12:
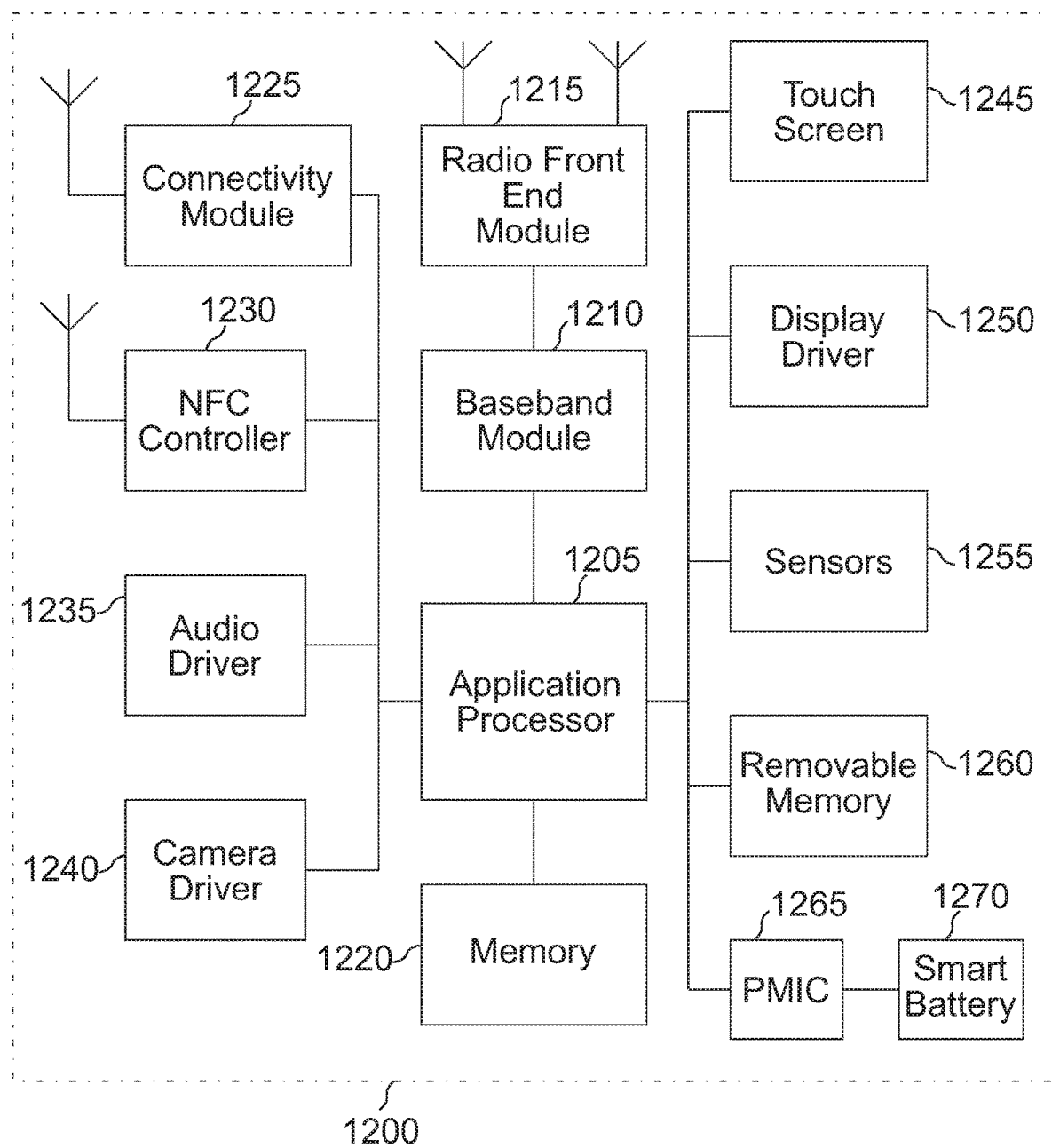
FIG. 12 illustrates a user device in which the examples disclosed herein may be implemented.

FIG. 12 illustrates a user device 1200 in which the examples disclosed herein may be implemented. The user device 1200 may be a mobile device in some aspects and includes an application processor 1205, baseband processor 1210 (also referred to as a baseband module), radio front end module (RFEM) 1215, memory 1220, connectivity module 1225, near field communication (NFC) controller 1230, audio driver 1235, camera driver 1240, touch screen 1245, display driver 1250, sensors 1255, removable memory 1260, power management integrated circuit (PMIC) 1265 and smart battery 1270.

In some aspects, application processor 1205 may include, for example, one or more CPU cores and one or more of cache memory, low drop-out voltage regulators (LDOs), interrupt controllers, serial interfaces such as serial peripheral interface (SPI), inter-integrated circuit (I²C) or universal programmable serial interface module, real time clock (RTC), timer-counters including interval and watchdog timers, general purpose input-output (IO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 1210 may be implemented, for example, as a solder-down substrate including one or more integrated circuits, a single packaged integrated circuit soldered to a main circuit board, and/or a multi-chip module containing two or more integrated circuits.

Figure 13:
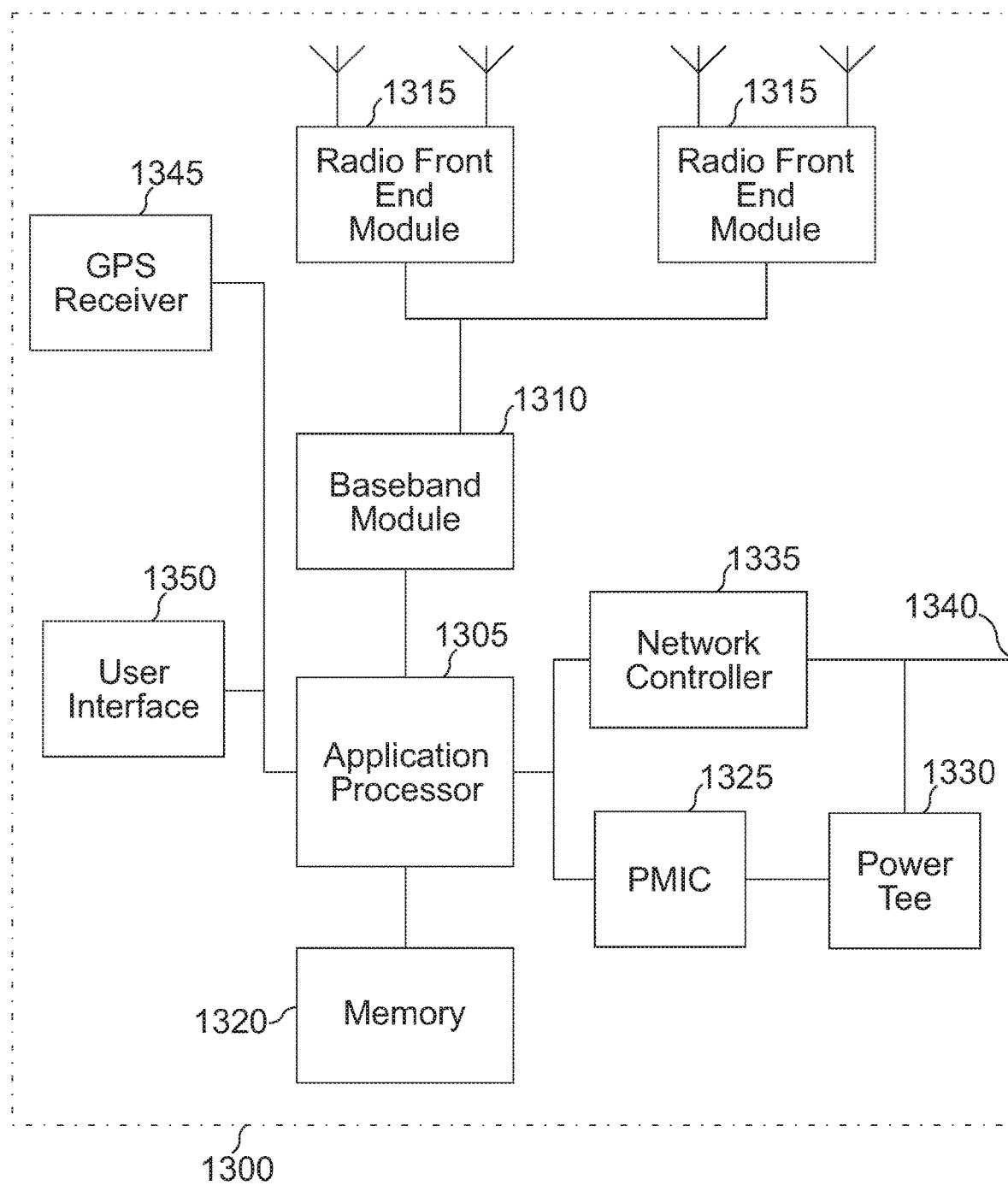
FIG. 13 illustrates a base station or infrastructure equipment radio head in which the examples disclosed herein may be implemented.

FIG. 13 illustrates a base station or infrastructure equipment radio head 1300 in which the examples disclosed herein may be implemented. The base station radio head 1300 may include one or more of application processor 1305, baseband modules 1310, one or more radio front end modules 1315, memory 1320, power management circuitry 1325, power tee circuitry 1330, network controller 1335, network interface connector 1340, satellite navigation receiver module 1345, and user interface 1350.

In some aspects, application processor 1305 may include one or more CPU cores and one or more of cache memory, low drop-out voltage regulators (LDOs), interrupt controllers, serial interfaces such as SPI, I²C or universal programmable serial interface module, real time clock (RTC), timer-counters including interval and watchdog timers, general purpose TO, memory card controllers such as SD/MMC or similar, USB interfaces, MIPI interfaces and Joint Test Access Group (JTAG) test access ports.

In some aspects, baseband processor 1310 may be implemented, for example, as a solder-down substrate including one or more integrated circuits, a single packaged integrated circuit soldered to a main circuit board or a multi-chip module containing two or more integrated circuits.

In some aspects, memory 1320 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magneto resistive random access memory (MRAM) and/or a three-dimensional crosspoint memory. Memory 1320 may be implemented as one or more of solder down packaged integrated circuits, socketed memory modules and plug-in memory cards.

In some aspects, power management integrated circuitry 1325 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 1330 may provide for electrical power drawn from a network cable to provide both power supply and data connectivity to the base station radio head 1300 using a single cable.

In some aspects, network controller 1335 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 1345 may include circuitry to receive and decode signals transmitted by one or more navigation satellite constellations such as the global positioning system (GPS), Global-naya Navigatsionnaya Sputnikovaya Sistema (GLONASS), Galileo and/or BeiDou. The receiver 1345 may provide data to application processor 1305 which may include one or more of position data or time data. Application processor 1305 may use time data to synchronize operations with other radio base stations.

In some aspects, user interface 1350 may include one or more of physical or virtual buttons, such as a reset button, one or more indicators such as light emitting diodes (LEDs) and a display screen.

Another example is a computer program having a program code for performing at least one of the methods described herein, when the computer program is executed on a computer, a processor, or a programmable hardware component. Another example is a machine-readable storage including machine readable instructions, when executed, to implement a method or realize an apparatus as described herein. A further example is a machine-readable medium including code, when executed, to cause a machine to perform any of the methods described herein.

The examples as described herein may be summarized as follows:

Example 1 is a circuit for electrostatic discharge protection. The circuit comprises a plurality of signal paths, each signal path includes an ESD protection circuit configured to shunt an ESD current on each signal path to either ground or supply voltage and a filter configured to block signals from other signal paths, and a common signal line connected to the plurality of signal paths and configured to transport signals for the plurality of signal paths simultaneously.

Example 2 is the circuit of example 1, wherein the filter configured to block signals from other signal paths is placed between the common signal line and the ESD protection circuit.

Example 3 is the circuit of example 1, wherein the plurality of signal paths include a high frequency path and a low frequency path.

Example 4 is the circuit as in any one of examples 1-3, wherein the ESD protection circuit includes at least one of a set of diodes, a set of ESD silicon-controlled rectifiers, SCRs, or gate-grounded n-channel/p-channel metal oxide semi-conductor, ggN/PMOS.

Example 5 is the circuit as in any one of examples 1-4, wherein the filter in the low frequency path includes an inductor connected in series and the filter in the high frequency path includes a capacitor or a transformer connected in series, wherein the ESD protection circuit on each signal path is placed behind the filter.

Example 6 is the circuit as in any one of examples 3-5, wherein the filter in the high frequency path includes a varactor.

Example 7 is the circuit of example 6, wherein the filter includes an ESD detection circuit configured to control capacitance of the varactor based on an ESD current.

Example 8 is the circuit of example 7, wherein the filter in the high frequency path includes a set of anode-to-anode connected varactors and the ESD detection circuit includes a Zener diode with a series resistor and a connection between anodes of the varactors and the Zener diode.

Example 9 is the circuit of example 8, wherein the connection includes a bias circuit for biasing an anode voltage of the varactors.

Example 10 is the circuit as in any one of examples 3-9, further comprising at least one MOS switch connected in series to the filter and a matching circuit comprising a resistor and/or an inductor in the high frequency path.

Example 11 is the circuit of example 10, wherein the MOS switch includes a resistor at a gate and/or a bulk of the MOS switch.

Example 12 is the circuit as in any one of examples 10-11, wherein a voltage in the high frequency path is clamped below a breakdown value by adjusting a number of the MOS switch and/or a resistance and/or an inductance value of the matching circuit.

Example 13 is the circuit as in any one of examples 1-12, wherein the plurality of signal paths support mm-wave Fifth Generation, 5G, interfaces.

Example 14 is the circuit as in any one of examples 1-13, wherein the plurality of signal paths include a high frequency path for supporting 28 GHz, 39 GHz, and 60 GHz bands and a low frequency path for supporting 330 MHz band.

Example 15 is the circuit as in any one of examples 3-14, wherein the low frequency path includes a capacitor connected in parallel for filtering a signal from the high frequency path.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A circuit for electrostatic discharge (ESD) protection, the circuit comprising:
   a plurality of signal paths, each signal path including an ESD protection circuit configured to shunt an ESD current on each signal path to either ground or supply voltage and a filter configured to block signals from other signal paths; and
   a common signal line connected to the plurality of signal paths and configured to transport signals for the plurality of signal paths simultaneously,
   wherein the plurality of signal paths include a high frequency path and a low frequency path,
   wherein the filter in the high frequency path includes a varactor and an ESD detection circuit configured to control capacitance of the varactor based on an ESD current.

2. The circuit of claim 1, wherein the filter configured to block signals from other signal paths is placed between the common signal line and the ESD protection circuit.

3. The circuit of claim 1, wherein the ESD protection circuit includes at least one of a set of diodes, a set of ESD silicon-controlled rectifiers (SCRs) or gate-grounded n-channel/p-channel metal oxide semi-conductor, ggN/PMOS.

4. The circuit of claim 1, wherein the filter in the low frequency path includes an inductor connected in series and the filter in the high frequency path includes a capacitor or a transformer connected in series, wherein the ESD protection circuit on each signal path is placed behind the filter.

5. The circuit of claim 1, wherein the filter in the high frequency path includes a set of anode-to-anode connected varactors and the ESD detection circuit includes a Zener diode with a series resistor and a connection between anodes of the varactors and the Zener diode.

6. The circuit of claim 5, wherein the connection includes a bias circuit for biasing an anode voltage of the varactors.

7. The circuit of claim 1, further comprising at least one metal-oxide-semiconductor (MOS) switch connected in series to the filter and a matching circuit comprising a resistor and/or an inductor in the high frequency path.

8. The circuit of claim 7, wherein the MOS switch includes a resistor at a gate and/or a bulk of the MOS switch.

9. The circuit of claim 7, wherein a voltage in the high frequency path is clamped below a breakdown value by adjusting a number of the MOS switch and/or a resistance and/or an inductance value of the matching circuit.

10. The circuit of claim 1, wherein the low frequency path includes a capacitor connected in parallel for filtering a signal from the high frequency path.

11. A device including the circuitry for electrostatic discharge (ESD) protection of claim 1.

12. The device of claim 11, wherein the filter configured to block signals from other signal paths is placed between the common signal line and the ESD protection circuit.

13. A device including circuitry for electrostatic discharge (ESD) protection, the device comprising:
    a plurality of signal paths, each signal path including a means for shunting an ESD current on each signal path to either ground or supply voltage and a means for blocking signals from other signal paths; and
    a common signal line connected to the plurality of signal paths and configured to transport signals for the plurality of signal paths simultaneously,
    wherein the plurality of signal paths include a high frequency path and a low frequency path,
    wherein the means for blocking in the high frequency path includes a varactor and an ESD detection circuit configured to control capacitance of the varactor based on an ESD current.

14. A circuit for electrostatic discharge (ESD) protection, the circuit comprising:
    a plurality of signal paths, each signal path including an ESD protection circuit configured to shunt an ESD current on each signal path to either ground or supply voltage and a filter configured to block signals from other signal paths; and
    a common signal line connected to the plurality of signal paths and configured to transport signals for the plurality of signal paths simultaneously,
    wherein the plurality of signal paths either support mm-wave Fifth Generation (5G) interfaces or include a high frequency path for supporting 28 GHz, 39 GHz, and 60 GHz bands and a low frequency path for supporting 330 MHz band.

* * * * *